United States Patent [19]
Freehauf

[11] 4,072,380
[45] Feb. 7, 1978

[54] DUAL INLINE INTEGRATED CIRCUIT SOCKET

[75] Inventor: Eugene G. Freehauf, Ontario, Calif.

[73] Assignee: Zero Corporation, El Monte, Calif.

[21] Appl. No.: 759,748

[22] Filed: Jan. 17, 1977

Related U.S. Application Data

[63] Continuation-in-part of Ser. No. 716,113, Aug. 20, 1976, abandoned.

[51] Int. Cl.² .............................................. H05K 1/12
[52] U.S. Cl. ................................................ 339/17 CF
[58] Field of Search ............... 339/14 R, 14 P, 17 CF, 339/17 L, 17 C, 176 M, 176 MP

[56] References Cited

U.S. PATENT DOCUMENTS

| 3,621,444 | 11/1971 | Stein | 339/14 R |
| 3,701,077 | 10/1972 | Kelly, Jr. | 339/17 CF |
| 3,750,085 | 7/1973 | Cooper | 339/17 CF |
| 3,778,754 | 12/1973 | Takahashi et al. | 339/17 CF |

*Primary Examiner*—Neil Abrams
*Attorney, Agent, or Firm*—Edward J. DaRin

[57] ABSTRACT

A dual inline integrated circuit socket having nonpluggable electrical pin positions relative to receiving the leads of an integrated circuit package. The socket provides this function by means of a cap having "blind" positions or a "short" cap to allow access to the nonpluggable electrical contacts.

12 Claims, 7 Drawing Figures

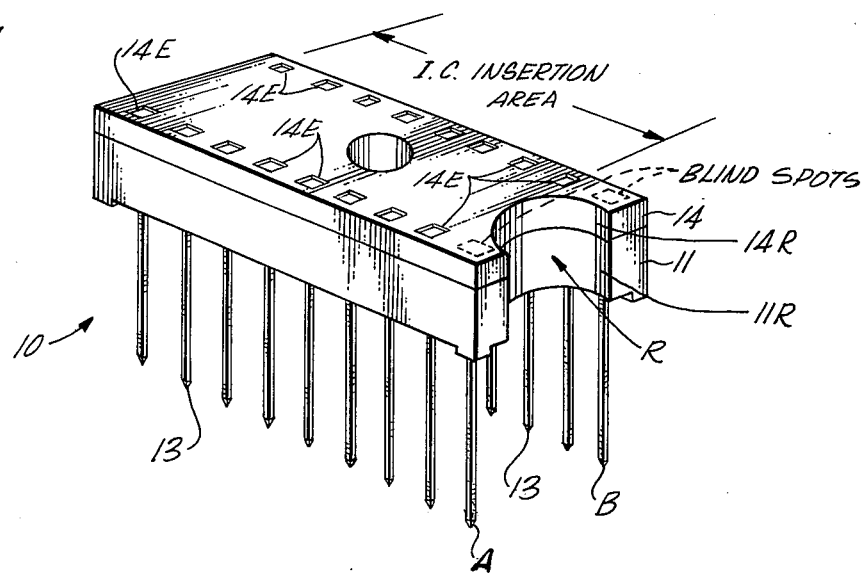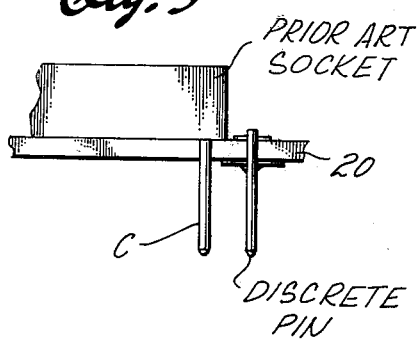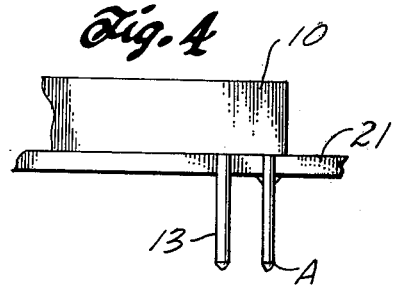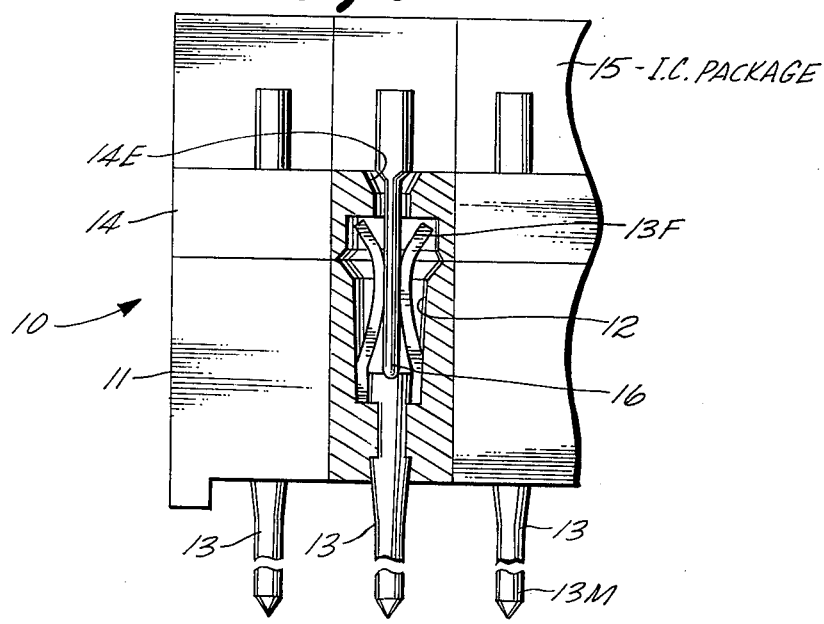

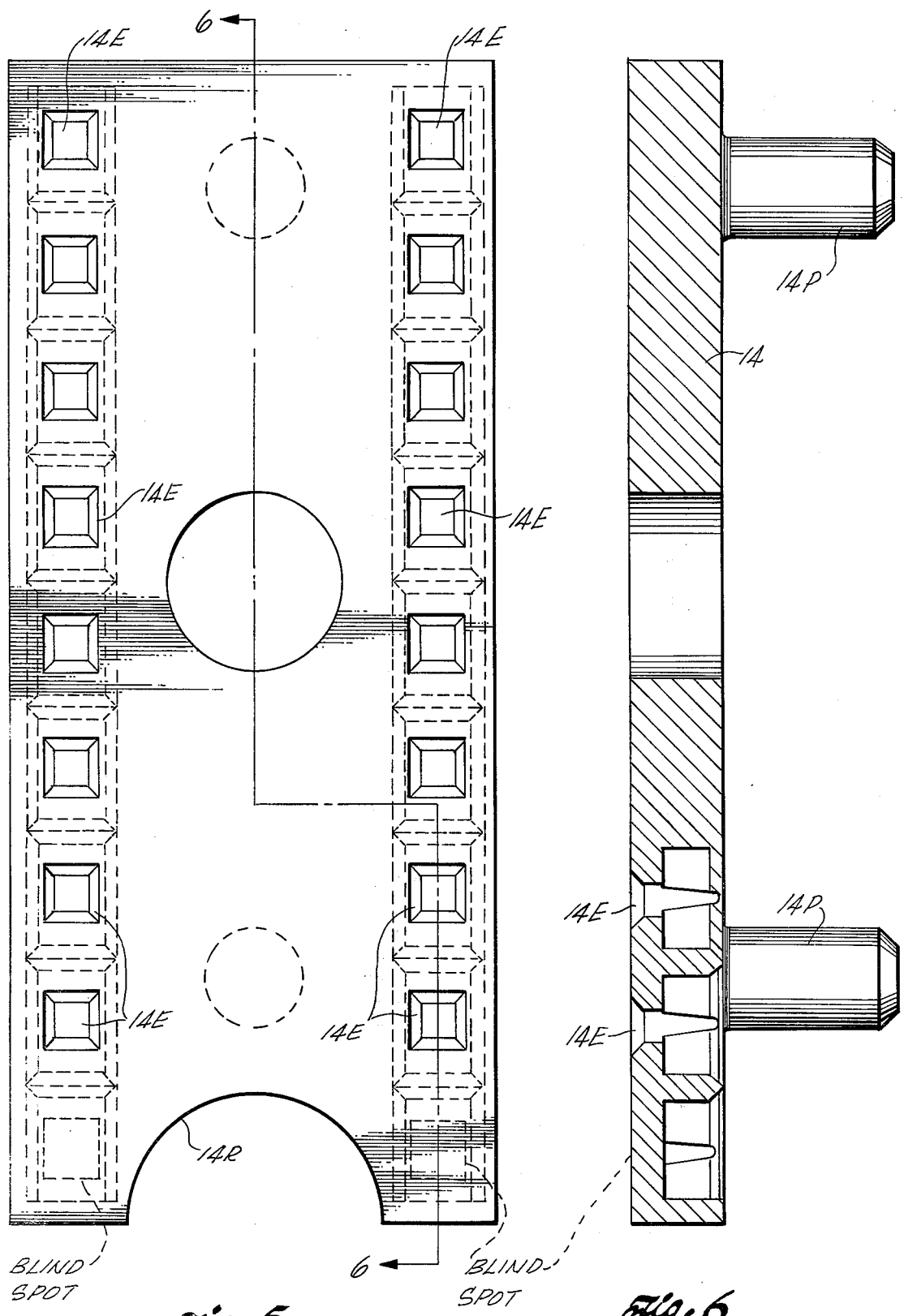

DUAL INLINE INTEGRATED CIRCUIT SOCKET

REFERENCE TO RELATED APPLICATIONS

This application is a continuation-in-part of the earlier filed application bearing Ser. No. 716,113 filed on Aug. 20, 1976; now abandoned.

PRIOR ART AND SUMMARY OF THE INVENTION

This invention relates to improved integrated circuit sockets.

Sockets are presently used for mounting integrated circuit packages on printed circuit boards and the like for connecting the circuits within the integrated circuit package into electrical circuit relationship with the other circuits of an electrical system, including the circuits printed on the boards. These sockets are referred to in the art as female receptacles for receiving dual inline integrated circuit packages or other similar devices. Such sockets are presently available from the Scanbe Division of Zero Corporation of El Monte, California, and are sold under the trademark "ME-2 SOCKETS". These sockets are known in the art as non-discrete sockets.

Integrated circuit sockets are generally attached to a printed circuit board for connecting integrated circuit packages into an electrical circuit relationship with the printed circuit deposited on the board. Very often in the use of non-discrete integrated circuit sockets of the type under consideration, the total electrical system demands additional voltage and ground or reference potential electrical conductors or pins to be used with individual printed circuit boards. This is presently accomplished by the use of distinctly separate pins inserted into the printed circuit board and soldered to the electrical system for coupling additional voltage or the reference potential thereto. These additional contacts or pins are generally free standing pins typically used for wire wrap applications.

The present invention provides an improved integrated circuit socket that includes one or two discrete pins in the integrated circuit socket to perform the identical electrical function performed by the additional voltage or ground pins presently mounted and secured to the printed circuit boards, and yet the socket functions to accept a dual line integrated circuit package. The discrete pins are embodied into a conventional integrated circuit socket insulator as one integral socket with a number of blind or nonpluggable locations. The improved integrated circuit socket of the present invention eliminates the need to precisely drill many holes in the printed circuit board, the procurement of such boards, as well as the installation of the additional discrete pins and the soldering to these additional pins thereby resulting in major significant saving in costs. The installation of such pins is generally accomplished by special machines and the elimination of which is in itself a significant cost savings.

These and other features of the present invention may be more fully appreciated when considered in the light of the following specification and drawings, in which:

FIG. 1 is a perspective view of an integrated circuit socket embodying the present invention;

FIG. 2 is a partial, elevational and sectional view illustrating an integrated circuit package mounted to an integrated circuit socket;

FIG. 3 is a diagrammatical representation of a prior art socket mounted to a printed circuit board and having an individual discrete voltage pin secured to the board;

FIG. 4 is a diagrammatical representation of the integrated circuit socket of FIG. 1 mounted to a printed circuit board in accordance with the present invention;

FIG. 5 is a top plan view of the detached cap of the integrated circuit socket of FIG. 1;

FIG. 6 is a cross-sectional view, with portions of elevation, of the cap of FIG. 5 taken along the line 6—6.

Figure 7:
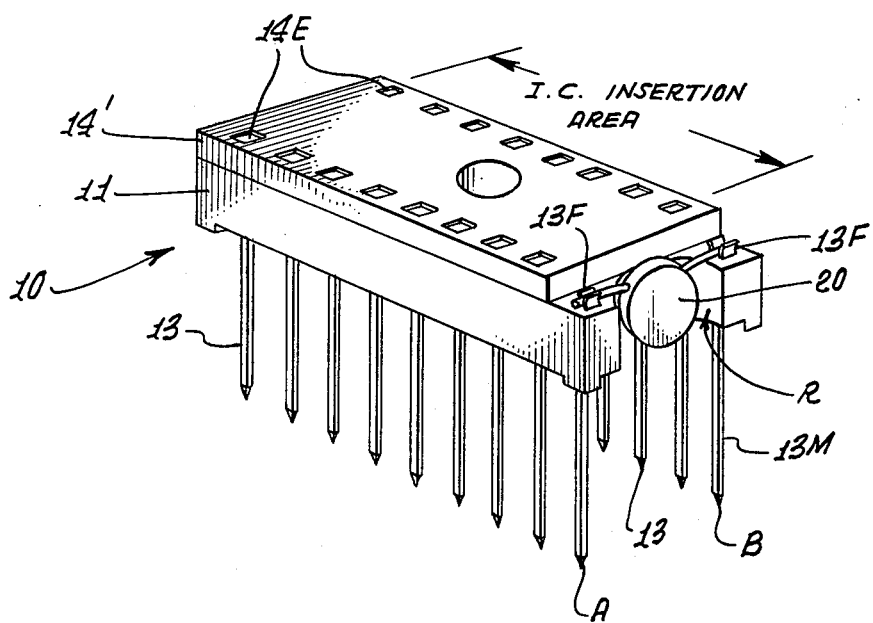
FIG. 7 is a perspective view of another embodiment of an integrated circuit socket and embodying the present invention.

Now referring to the drawings the improved integrated circuit socket 10 of the present invention will be described in detail. The invention will be described as it may be embodied in a commercially available integrated circuit socket of the type of the "ME-2" socket manufactured and sold by the Scanbe Division of Zero Corporation of El Monte, California. Although the concept will be described in conjunction with the Scanbe "ME-2" socket, it may be integrated into the same type of sockets of the type manufactured and sold by other packaging people.

The integrated circuit socket 10 comprises an insulative body 11 having a plurality of socket apertures 12 extending through the body and arranged in aligned rows adjacent opposite edges of the body. One such socket aperture 12 is illustrated in FIG. 2. The plurality of socket apertures 12 mount a corresponding plurality of individual electrical conducting contacts 13 in each of the apertures. Each of the electrically conducting contacts 13 comprises a female socket portion 13F constructed and defined at one end and a male terminal portion 13M extending therefrom. When mounted within the insulative body 11, the female portion 13F of the contact is located completely within the socket aperture 12 with the male portion 13M thereof depending from the bottom side from the insulating body 11, as can be best appreciated by examining FIG. 2. The socket 10 also includes a cap member 14 having a plurality of entry apertures 14E constructed and defined to extend through the cap member and arranged in aligned longitudinal rows adjacent opposite edges of the cap member so as to overlie the socket apertures 12 provided for the insulative body 11. The cap member 14 is secured to the insulative body 11 with the entry apertures 14E mounted in vertical alignment with the female socket portion 13F of the contacts 13. The cap member 14 may be removably secured to the insulative body element 11 by any conventional means and is secured in the "ME-2" socket by means of a snap lock between the cap and the body member. For this purpose, a pair of locking posts 14P are provided to depend from the cap to be secured to the insulative body 12. The number of entry apertures 14E defined in the cap member 14 is conventionally equivalent to the number of socket apertures 12 provided in the body 10 to allow the lead wires from the integrated circuit packages to be mounted through the cap member 14 and into the electrical conducting relationship with the contacts 13 in the insulative body 12. In FIG. 2, an integrated circuit package 15 is illustrated with its lead wire 16 mounted in electrical conducting relationship with the female portion 13F of the contact element 13.

The above-described structure for the socket 10 is of conventional construction and forms no part of the present invention.

In accordance with the present invention, the cap element 14 of the commercially available integrated circuit socket is modified to provide one or more blind spots to allow one or more nonpluggable pins to be integrally defined with the socket 10. For this purpose, the blind spots consist of the elimination of one or more entry apertures 14E in the cap member to prevent the insertion of an integrated circuit package lead wire at the selected blind locations. In FIG. 1, two blind spots are identified on the cap 14 and are illustrated overlying the pins A and B. The pins A and B are utilized in accordance with the present invention for performing the identical function that the prior art discrete pins are provided and individually mounted to the integrated circuit board.

The socket 10 is also constructed and defined with a relief area R at one end of the socket 10. The relief area R may be comprised of a cutout section in the insulative element 11 and in the cap 14 that overlie one another to provide an area to facilitate the clearance of other items, such as capacitors, resistors, or the like, that are conventionally mounted on the printed circuit board adjacent the end of a non-discrete socket. The relief area R consists of a cutout area 11R defined in the insulative body with a coaxial cutout area 14R defined in the cap 14 as illustrated in FIG. 1.

In FIG. 3, there is illustrated a prior art integrated circuit socket mounted on a printed circuit board 20. The prior art socket is illustrated with its contacts C extending from the opposite sides of the board 20 from which the socket is mounted. In this prior art application, a discrete voltage pin is illustrated in a mounted and secured relationship with the board adjacent the socket. These discrete pins are generally attached to the printed circuit board for providing the additional voltage and ground potentials that are required for the board 20 and must be provided in accordance with present day techniques. In FIG. 4, there is illustrated the socket 10 of the present invention in diagrammatic form mounted to a printed circuit board 21 illustrating an electrical conducting contact 13 depending from the socket 10 on the opposite side of the board 21 from the socket 10. In addition, the nonpluggable contact A is illustrated extending from the socket 10 and depending from the board 21. In this instance, the socket A is soldered to the board 21 and may be used for the identical electrical function as the discrete pin illustrated in FIG. 3, without the necessity for all of the operations required for locating, mounting, and the electrical soldering of a discrete pin, thereby resulting in a substantial cost savings.

Now referring to FIG. 7, another embodiment of the dual inline integrated circuit socket will be examined. The socket 10 illustrated in FIG. 7 is of the same construction as the socket described hereinabove except that the cap 14' is modified from the socket 14 by making it shorter in length than the length of the insulative body 11. The cap 14' is made shorter for defining the nonpluggable pin positions as in the previous embodiments but instead of defining "blind spots" the shorter length for the cap 14' allows the upper end of the electrical conducting contacts 13 to be exposed and in particular the female portion 13F, as is clearly evident from examining FIG. 7.

It has been found that in the electrical components industry it is often desirable to apply an electrical capacitor in the circuit to act as an electrical by-pass component. This is generally accomplished by connecting one lead of the electrical capacitor to the voltage side of a device and the other lead of the same capacitor to the reference potential or ground. This is often implemented by means of providing additional holes in the printed circuit board which holes are typically encompassed by a round conductive pad connected to either a voltage plane or a ground plane. The capacitor is connected to the appropriate conductive pad.

The integrated circuit socket 10 illustrated in FIG. 7 eliminates the need for the provision of additional holes in a printed circuit board and yet allows an electrical component to be readily connected between two points of potential by utilizing the advantageous features of the integrated circuit socket 10 described herein and combining the socket into a modular structure. As illustrated in FIG. 7, an electrical component in the form of an electrical capacitor 20 has its lead wires secured into the individual female contacts 13F of the electrical contacts 13 arranged in the nonpluggable pin positions of the socket 10. These pins are further identified by the reference letters A and B. The lead wires of the capacitor 20 may be electrically connected to the contacts 13 by soldering or the like to provide the desired electrical continuity with contacts 13. When the pins A and B are connected to the respective voltage and ground planes, the capacitor 20 will then be electrically connected to its plane to provide the function previously performed by mounting the electrical component to the printed circuit board proper and with a minimum of expense or manufacturing cost.

The capacitor 20, as illustrated in FIG. 7, is mounted in the relief area R provided for the insulative body 11 between the exposed pin A and B and at one end thereof as described above. The electrical component, however, can be mounted in any other convenient location such as above the top plane of the insulative body 11.

With the structure of the embodiment of FIG. 7, it should be recognized that the nonpluggable pin positions relative to receiving the leads of an integrated circuit package may be defined solely by means of the "short" cap 14' without reference to the securing of an electrical component to the nonpluggable pins A and B.

From the above description it should be appreciated that the present invention has advanced the state of the integrated circuit socket art by a relatively simple modification of present day integrated circuit sockets and yet has accomplished functions that require much time, effort and money to accomplish with present day printed circuit boards and sockets, thereby resulting in substantial savings in the use of integrated circuit packages.

What is claimed is:

1. An improved socket for receiving the leads of a dual inline integrated circuit package or the like pluggable unit comprising:
an insulative body having a plurality of longitudinally spaced apart socket apertures extending through the body and arranged adjacent opposite longitudinal edges of the body in parallel aligned rows, the spacing between each of the sockets in said rows being substantially the same,
a plurality of electrical conducting contacts having a female socket portion constructed and defined at one end and a male terminal extending therefrom, the contacts being mounted and held in each of the socket apertures with the male terminals extending outwardly from one side of the insulative body, and an insulative cap member having a preselected length with a plurality of longitudinally spaced apart entry apertures constructed and defined to extend through the cap member and arranged in aligned parallel rows adjacent opposite edges of the cap member, the cap member being secured to the insulative body with each of the entry apertures mounted in vertical alignment with the corresponding female socket portions, the number of entry apertures defined in the cap member being less than the number of socket apertures containing female socket portions in the insulative body but permitting the leads of an integrated circuit package or the like pluggable unit to be mounted into the entry apertures of the cap member in an electrical conducting relationship with the electrical contacts.

2. An improved integrated circuit socket as defined in claim 1 wherein the insulative body has N socket apertures and the cap member has N minus a number equal to or greater than the entry apertures defined therein.

3. An improved integrated circuit socket as defined in claim 2 wherein the cap member has N-2 entry apertures with one blind spot arranged in each row of entry apertures over a socket aperture.

4. An improved integrated circuit socket as defined in claim 3 wherein the blind spots are arranged at the ends of each row of entry apertures.

5. An improved integrated circuit socket as defined in claim 4 wherein the blind spots are arranged at the same end of each row of entry apertures.

6. An improved integrated circuit socket as defined in claim 5 wherein the insulative body and cap member are both defined to have essentially the same length and width with a coextensive relief area defined in the body and cap member at said same end.

7. An improved socket as defined in claim 1 wherein the cap member has a preselected length shorter than the length of the insulative body but having said number of entry apertures and the electrical contacts are mounted in the body at the location corresponding to a location outside the perimeter of the cap member and the short length of the cap member exposes and allows access to at least a pair of the electrical conducting contacts at the female socket portions thereof at an upper surface of the insulated body, and the insulative body is constructed and defined with a relief area intermediate the end of the cap member and the insulative body, and an electrical component secured to said pair of electrical contacts at said socket portions.

8. An improved socket as defined in claim 7 wherein the electrical component is an electrical capacitor.

9. An improved socket as defined in claim 1 wherein the cap member has a preselected length shorter than the length of the insulative body and electrical contacts are mounted in each of the socket apertures, the length of the cap member is selected to expose and allow access to at least a pair of the electrical contacts at the female socket portions at an upper surface of the insulative body and outside the perimeter of the cap member.

10. An improved socket as defined in claim 9 wherein the cap member allows access to the pir of electrical contacts arranged adjacent an end of the insulative body and on opposite sides thereof and the insulative body is constructed and defined with a relief area intermediate said pair of electrical contacts and outside the perimeter of the cap member.

11. An improved socket including an insulative body having a preselected length for defining a pair of rows of longitudinally extending equally spaced apart sockets arranged therein for mounting electrical contact elements in the sockets, the number of sockets being N, and an insulative cap removably secured to the body, the cap having a length to at least overlie the socket openings in the insulative body and having entry apertures therein for permitting electrical access through the cap to electrical contact elements mounted in each of the sockets, the improvement comprising an insulative cap member having a length to at least overlie all of the socket openings in the insulative body but having N minus a number equal to or greater than 1 entry apertures for the sockets that it overlies, the entry apertures are arranged in longitudinally extending parallel rows adjacent opposite edges of the cap member for permitting electrical contact with an electrical contact arranged in the socket through an entry aperture and with one blind spot arranged at the same end of each row of entry apertures over an entry aperture for preventing electrical contact with an electrical contact arranged in the socket at the blind spot, the cap member being adapted to be removably secured to one side of the insulative body.

12. An improved socket as defined in claim 11 wherein the blind spots are arranged at the ends of each row of entry apertures.

* * * * *